(12) United States Patent
Horng et al.

(10) Patent No.: US 8,623,669 B2
(45) Date of Patent: Jan. 7, 2014

(54) METHOD OF FABRICATING EPITAXIAL SEMICONDUCTOR DEVICES

(75) Inventors: Ray-Hua Horng, Taichung (TW); Ming-Chun Tseng, Kaohsiung (TW)

(73) Assignee: National Cheng Kung University (TW)

( * ) Notice: Subject to any disclaimer, the term of this patent is extended or adjusted under 35 U.S.C. 154(b) by 240 days.

(21) Appl. No.: 13/206,033

(22) Filed: Aug. 9, 2011

(65) Prior Publication Data

US 2012/0107962 A1    May 3, 2012

(30) Foreign Application Priority Data

Nov. 1, 2010    (TW) ............................... 99137459 A (51) Int. Cl.
*H01L 21/00*    (2006.01)

(52) U.S. Cl.
USPC ................ 438/3; 438/481; 136/252; 136/254

(58) Field of Classification Search
CPC ..................... H01L 21/02293; H01L 2121/20; H01L 21/36; H01L 31/042
USPC .............. 438/3, 481; 136/243, 244, 249, 252, 136/254
See application file for complete search history.

(56) References Cited

U.S. PATENT DOCUMENTS

| | | | | |
|---|---|---|---|---|
| 5,963,790 A | * | 10/1999 | Matsuno et al. | 438/72 |
| 8,330,036 B1 | * | 12/2012 | Park | 136/249 |
| 2005/0023145 A1 | * | 2/2005 | Cohen et al. | 205/118 |

OTHER PUBLICATIONS

Schermer et al., 2006, "Photon Confinement in High-Efficiency, Thin-film III-V Solar Cells Obtained by Epitaxial Lift-Off", Thin Solid Films, vol. 511-512 645-653.

* cited by examiner

*Primary Examiner* — Khiem D Nguyen
(74) *Attorney, Agent, or Firm* — Law Offices of Albert Wai-Kit Chan, PLLC (57) ABSTRACT

A method of fabricating epitaxial semiconductor devices includes: (a) forming an etch limiting film that includes a sacrificial layer on an epitaxial substrate; (b) growing epitaxially layers of a semiconductor structure on the sacrificial layer; (c) forming on the semiconductor structure a layer of a device substrate that can be magnetized, and a patterned passage unit that extends from the device substrate to a depth as deep as the sacrificial layer such that a plurality of semiconductor units are defined in the semiconductor structure and the device substrate; and (d) separating the semiconductor units from the epitaxial substrate by etching laterally the sacrificial layer through the patterned passage unit while a magnetic attraction force is applied to the device substrate.

9 Claims, 10 Drawing Sheets

METHOD OF FABRICATING EPITAXIAL SEMICONDUCTOR DEVICES

CROSS-REFERENCE TO RELATED APPLICATION

This application claims priority of Taiwanese application no. 099137459, filed on Nov. 1, 2010.

BACKGROUND OF THE INVENTION

1. Field of the Invention

This invention relates to a method of fabricating semiconductor devices, more particularly to a method of fabricating epitaxial semiconductor devices.

2. Description of the Related Art

In general, the efficiency of an epitaxial semiconductor device, such as a light emitting diode, a laser diode, a solar cell, etc., is decided primarily by the crystal quality of an epitaxial layer of the epitaxial semiconductor device, which may function based on electroluminescence or photoelectric effects during operation. The epitaxial layer is generally formed by epitaxially growing a semiconductor material on an epitaxial substrate. However, most epitaxial substrates have a poor thermal dissipation property that may result in thermal accumulation during operation. Moreover, the cost of the epitaxial substrate is relatively expensive.

At present, methods of separating the epitaxial layer from the epitaxial substrate and attaching an alternative substrate to the epitaxial layer are conducted for overcoming the above drawbacks. The alternative substrate has a superior thermal dissipation property, and the fabrication cost may be cut down by recycling the expensive epitaxial substrate.

Figure 1:
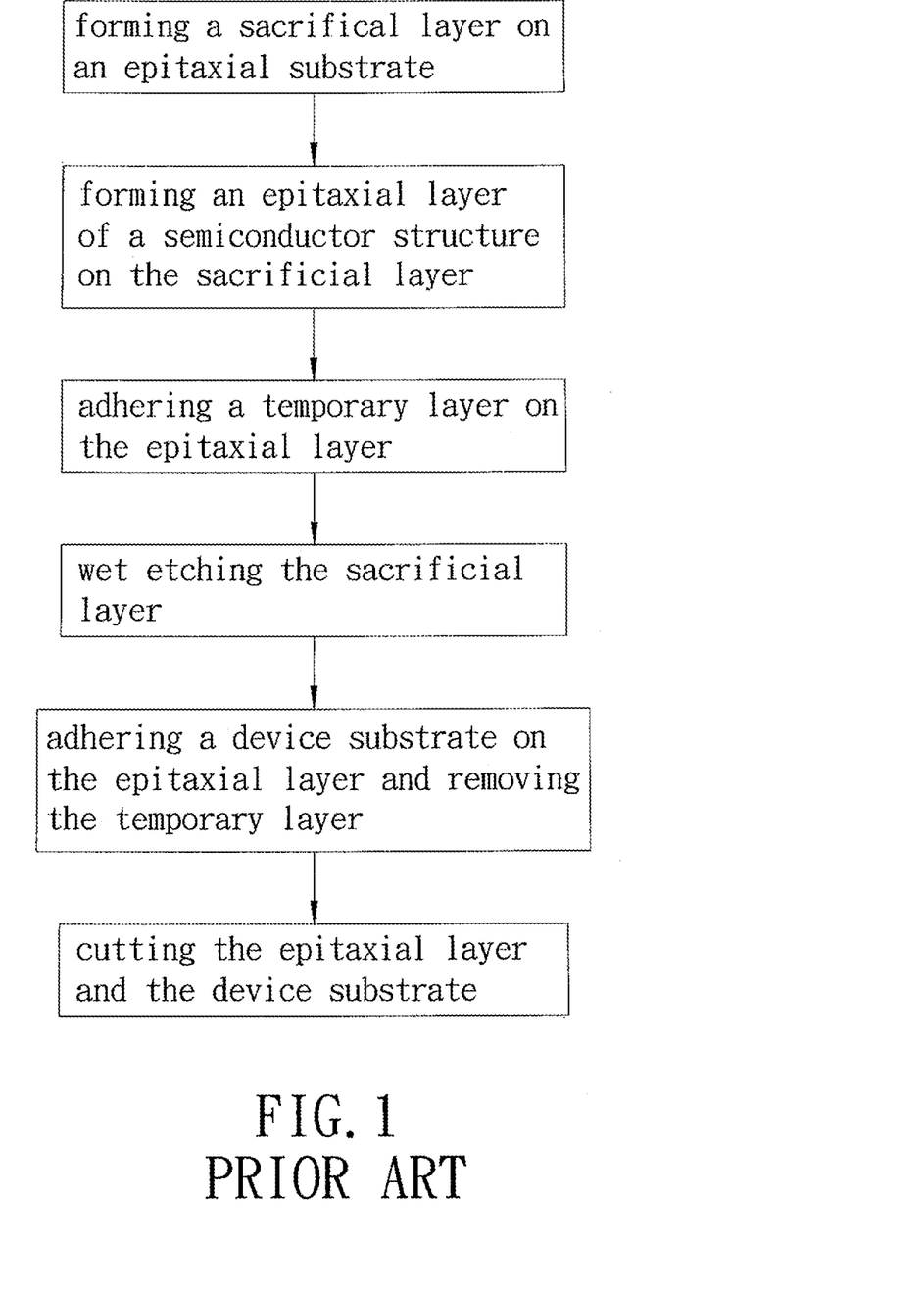
FIG. 1 is a flow chart showing a conventional fabrication process of fabricating an epitaxial semiconductor chip.

Referring to FIG. 1, a conventional fabrication process for making an epitaxial semiconductor chip includes: (a) forming a sacrificial layer on an epitaxial substrate that is formed of single crystal GaAs in the form of a wafer and that has an etching property_quite different from that of the sacrificial layer; (b) epitaxially forming an epitaxial layer of a semiconductor structure on the sacrificial layer, the etching properties of the epitaxial layer and the sacrificial layer are also quite different such that the two layers have a highly selective etch ratio; (c) adhering a temporary layer on the epitaxial layer opposite to the sacrificial layer; (d) wet etching laterally the sacrificial layer along a periphery thereof in order to separate the epitaxial layer from the epitaxial substrate; (e) adhering a device substrate on the epitaxial layer opposite to the temporary layer using a polymer adhesive and removing the temporary layer; and (f) cutting the epitaxial layer and the device substrate to form a plurality of epitaxial semiconductor chips.

In the step (d) of the conventional fabrication process, the sacrificial layer is wet etched merely laterally along a periphery thereof. The efficiency of the etching may be reduced when the size of the epitaxial layer becomes larger.

Figure 2:
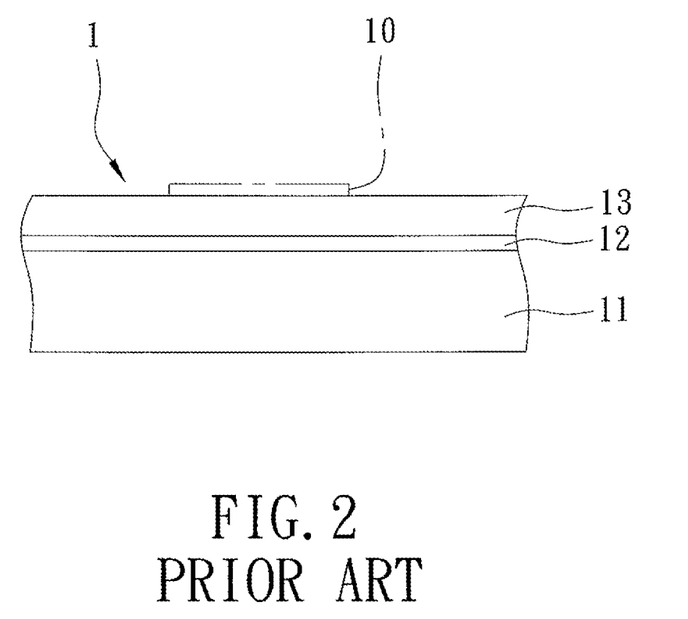
FIG. 2 is a schematic view of a conventional epitaxial semiconductor chip made from the conventional process of FIG. 1.

As shown in FIG. 2, an epitaxial semiconductor chip 1 made from the aforesaid conventional fabrication process includes a device substrate 11, an epitaxial layer 13 of a semiconductor structure, and a polymer adhesive layer 12 used to adhere the device substrate 11 to the epitaxial layer 13. The polymer adhesive layer 12 of the epitaxial semiconductor chip 1 has a low thermal dissipation property and is easily influenced by the environment. When a device made from the epitaxial semiconductor chip 1 is in use, the internal heat generated by the epitaxial layer 13 may not be dissipated through the polymer adhesive layer 12 and the device substrate 11, and failure of the device may occur.

Figure 3:
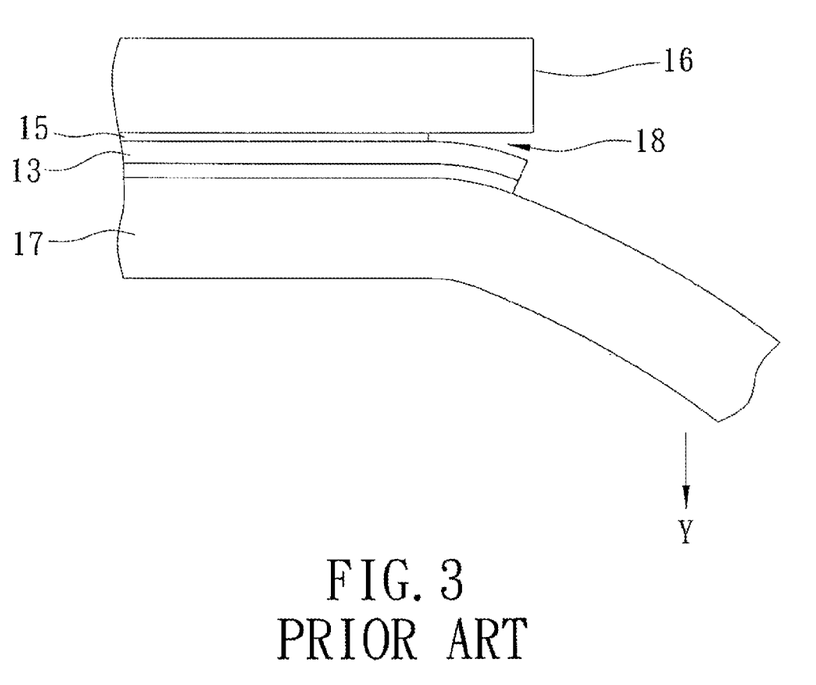
FIG. 3 is a schematic view illustrating an epitaxial lift-off (ELO) method of fabricating an epitaxial semiconductor device in the presence of a flexible temporary carrier.

Referring to FIG. 3, J. J. Schermer et al. (ELSEVIER, *Thin Solid Films,* 511-512 (2006) 645-653) disclosed an epitaxial lift-off (ELO) process that is used at Radboud University and that is capable of efficiently separating an epitaxial layer 13 from an epitaxial substrate 16. The steps of the lift-off process are similar to the aforesaid conventional fabrication process except that a temporary carrier 17 made from a flexible material and having a size larger than the epitaxial layer 13 is adhered thereto. When a release layer 15 is wet etched along a periphery thereof, the flexible temporary carrier 17 is bent attributed to an external force (Y) applied to the flexible temporary carrier 17. A space 18 between the epitaxial substrate 16 and the epitaxial layer 13 is therefore formed and enlarged so as to increase the contact area of an etchant, thereby resulting in an increase in the etching rate. However, the lift-off method shown in FIG. 3 has a disadvantage that the bending curvature of the flexible temporary carrier 17 involves a higher risk of breaking the epitaxial layer 13.

It is desired in the art to provide a fabrication process for efficiently and safely separating the epitaxial layer from the epitaxial substrate.

SUMMARY OF THE INVENTION

Therefore, the object of the present invention is to provide a method of fabricating epitaxial semiconductor devices that can overcome the aforesaid drawbacks of the prior art.

According to the present invention, a method of fabricating epitaxial semiconductor devices includes: (a) forming an etch limiting film that includes a sacrificial layer on an epitaxial substrate; (b) growing epitaxially layers of a semiconductor structure on the sacrificial layer; (c) forming on the semiconductor structure a layer of a device substrate that can be magnetized, and a patterned passage unit that extends from the device substrate to a depth as deep as the sacrificial layer such that a plurality of semiconductor units are defined in the semiconductor structure and the device substrate; and (d) separating the semiconductor units from the epitaxial substrate by etching laterally the sacrificial layer through the patterned passage unit while a magnetic attraction force is applied to the device substrate.

BRIEF DESCRIPTION OF THE DRAWINGS

Other features and advantages of the present invention will become apparent in the following detailed description of the preferred embodiments of the invention, with reference to the accompanying drawings, in which:

FIG. 4 to FIG. 8 show successive steps of the first preferred embodiment of a method of fabricating epitaxial semiconductor devices according to the present invention;

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

FIGS. 4 to 8 illustrate the first preferred embodiment of a method of fabricating epitaxial semiconductor devices according to the present invention.

Figure 4:
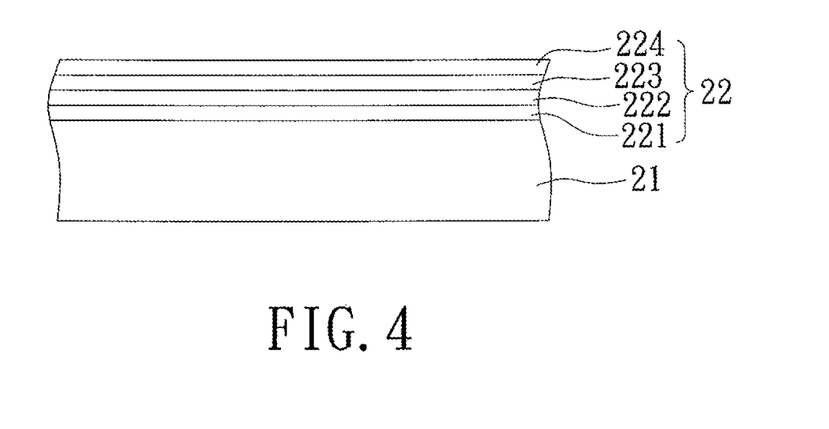

As shown in FIG. 4, a first buffer layer 221, an etch termination layer 222, a second buffer layer 223, and a sacrificial layer 224 are formed in the order as specified on an epitaxial substrate 21 that is made of single crystal GaAs in the form of a wafer. The first and second buffer layers 221, 223 are formed to adjust the epitaxial structure of layers formed thereabove. The first buffer layer 221, the etch termination layer 222, the second buffer layer 223, and the sacrificial layer 224 cooperatively define an etch limiting film 22. The etching properties of the epitaxial substrate 21 and the sacrificial layer 224 are quite different, i.e., the epitaxial substrate 21 and the sacrificial layer 224 have a high selective etch ratio, such that the sacrificial layer 224 can be removed by etching in a successive step without damage to the epitaxial substrate 21.

Figure 5:
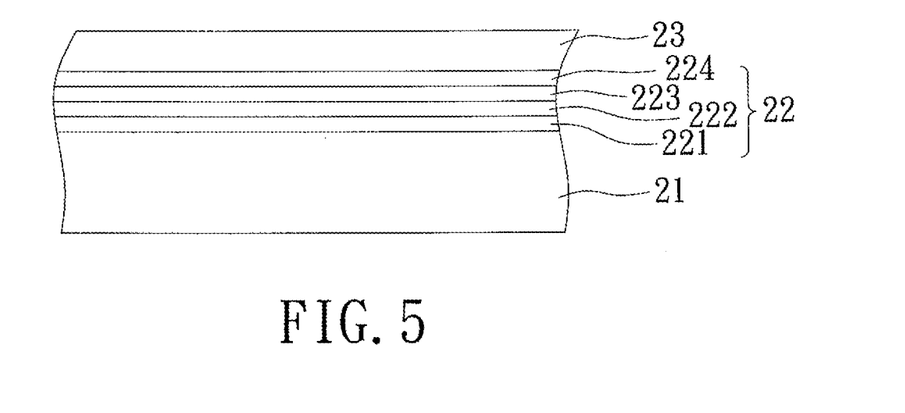

As shown in FIG. 5, a layer of a semiconductor structure 23 is grown epitaxially on the sacrificial layer 224. Similarly, the layer of the semiconductor structure 23 and the sacrificial layer 224 have a high selective etch ratio such that the layer of the semiconductor structure 23 may not be damaged when the sacrificial layer 224 is etched in a successive step.

Figure 6:
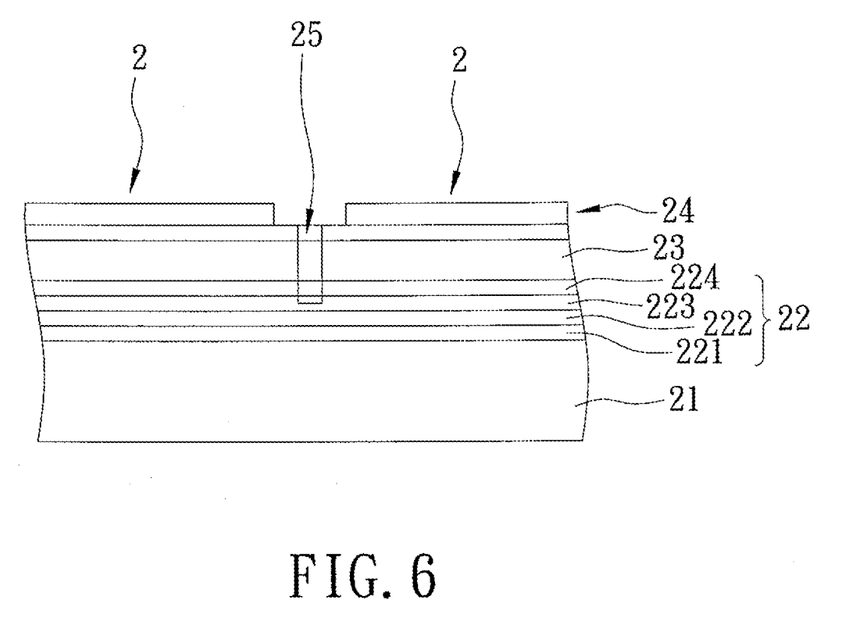

Referring to FIG. 6, a layer of a device substrate 24 that can be magnetized and a patterned passage unit 25 that extends from the device substrate 24 to a depth as deep as the sacrificial layer 224 are formed on the semiconductor structure 23 subsequently. Thus, a plurality of semiconductor units 2 are defined in the semiconductor structure 23 and the device substrate 24.

To be specific, the steps of forming the device substrate 24 and the patterned passage unit 25 include: forming on the layer of the semiconductor structure 23 one of a conductive substrate layer 241 and a magnetic layer 242; etching the layer of the semiconductor structure 23 and the etch limiting film 22 by using the one of the conductive substrate layer 241 and the magnetic layer 242 as a mask to form the patterned passage unit 25; filling a filler 27 in the patterned passage unit 25 until the filler 27 overflows from the patterned passage unit 25; forming the other one of the conductive substrate layer 241 and the magnetic layer 242 on the previous one of the conductive substrate layer 241 and the magnetic layer 242 without covering the filler 27 that overflows; and etching the filler 27 from a part of the filler 27 that overflows and removing the filler 27 entirely from the patterned passage unit 25. The patterned conductive substrate layer 241 and the magnetic layer 242 cooperatively define the device substrate 24.

Particularly, in the first preferred embodiment, the patterned conductive substrate layer 241 is formed prior to the magnetic layer 242, and the steps are described below.

Figure 7A:
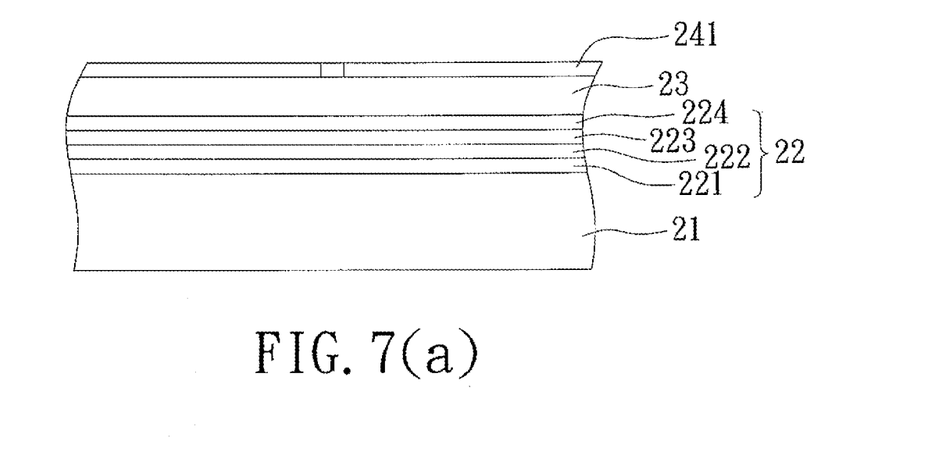

As shown in FIG. 7(a), the patterned conductive substrate layer 241 made from a conductive material, e.g., Au, Ni, Cu, Co, or their relative alloys, is formed on the layer of the semiconductor structure 23 by electroplating. The patterned conductive substrate layer 241 is formed to serve as a seed layer for electroplating a magnetic layer thereon.

Figure 7B:
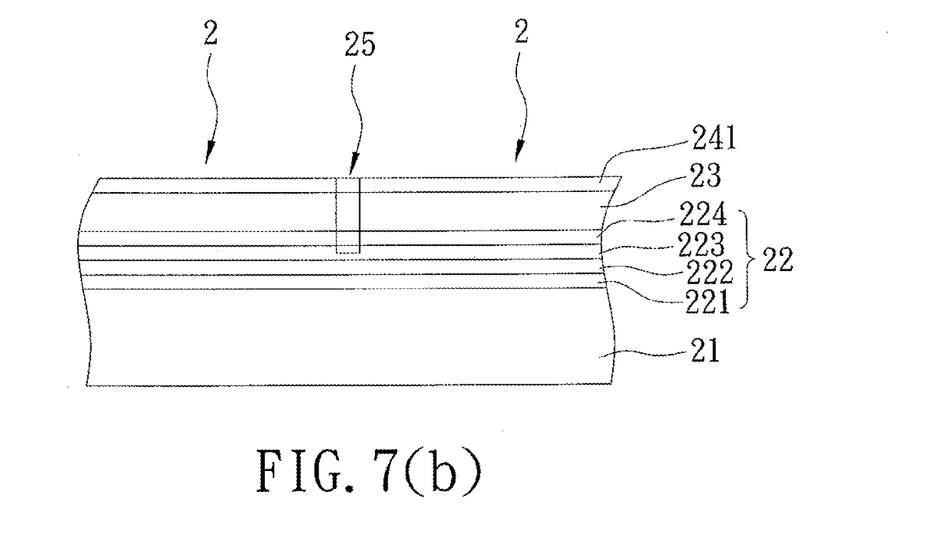

As shown in FIG. 7(b), the layer of the semiconductor structure 23 and the etch limiting film 22 are dry etched using the patterned conductive substrate layer 241 as a mask to form the patterned passage unit 25. The patterned passage unit 25 extends from the patterned conductive substrate layer 241 to a depth as deep as the sacrificial layer 224. Preferably, the patterned passage unit 25 extends to the second buffer layer 223. In such case, the etch termination layer 222 and the second buffer layer 223 are to be designed to have a highly selective etch ratio such that, in a successive step, the etching rate of the sacrificial layer 224 can be increased, thereby resulting in an improvement in removal of the sacrificial layer 224.

Figure 7C:
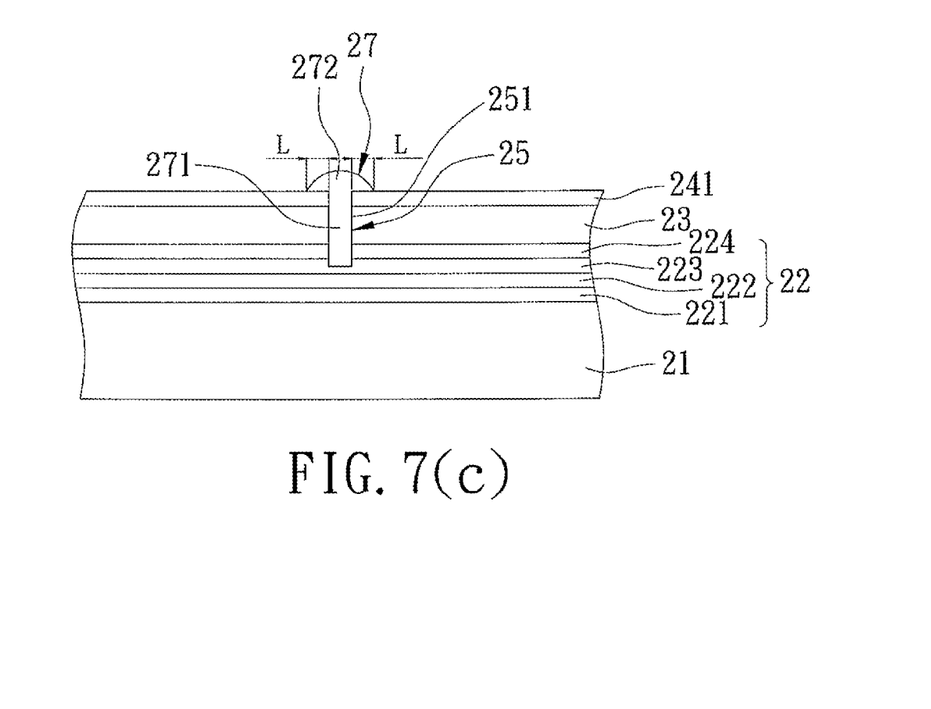
Figure 7D:
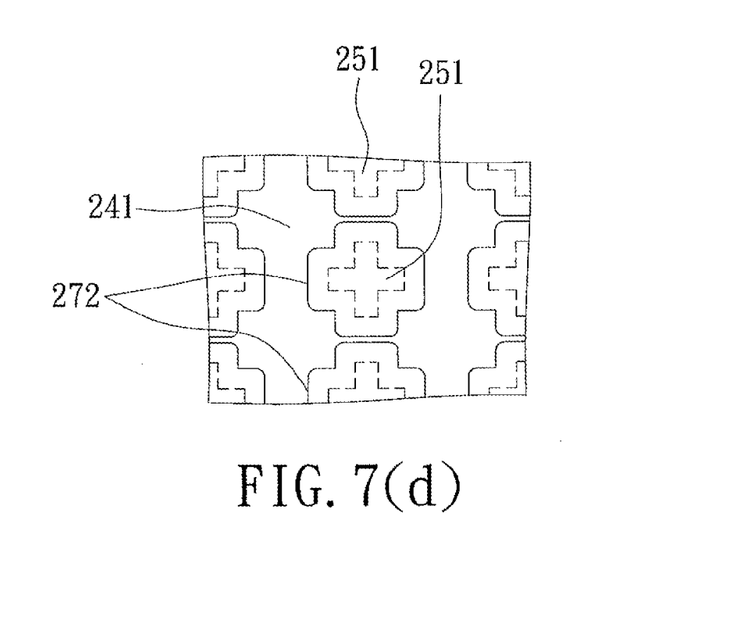

Referring to FIGS. 7(c) and 7(d), a filler 27 is filled in the patterned passage unit 25 until the filler 27 overflows to a surface of the conductive substrate layer 241. Preferably, the filler 27 is made from a photoresist material commonly used in a photolithography process.

In particular, the patterned passage unit 25 may include a plurality of passages 251 arranged in a pattern and each of which extends downwardly from the patterned conductive substrate layer 241 to the second buffer layer 223 as shown in FIGS. 7(c) and 7(d). The filler 27 forms a filler body 271 within each of the passages 251 and a protruding part 272 protruding laterally from a top periphery of the respective one of the passages 251. Preferably, a distance from an outer peripheral end of the protruding part 272 to the top periphery of the respective passage 251 (indicated as "L" in FIG. 7(c)) is larger than 30 μm such that, in a successive electroplating step, the layer of the semiconductor structure 23 may not be electrically connected with the device substrate 24.

Figure 7E:
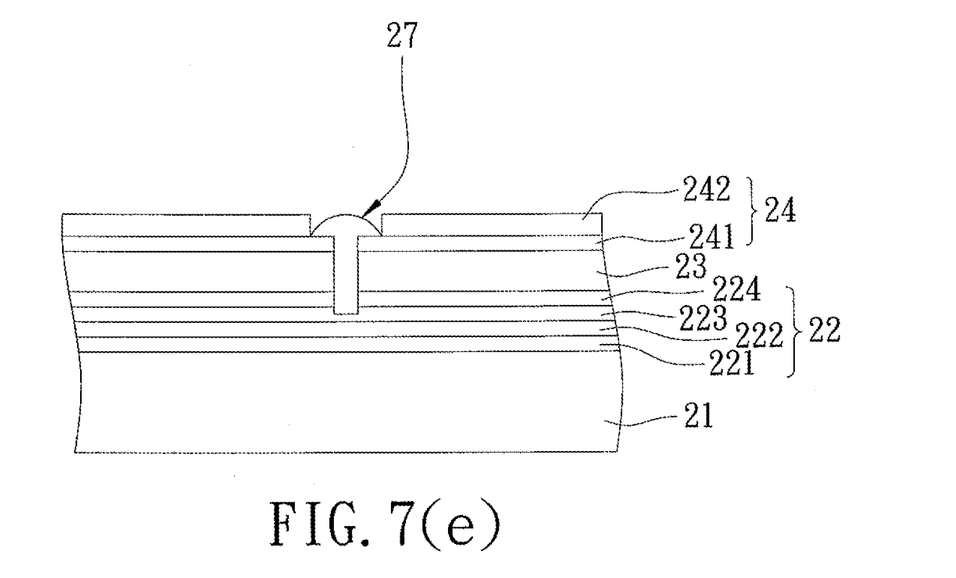
Figure 7F:
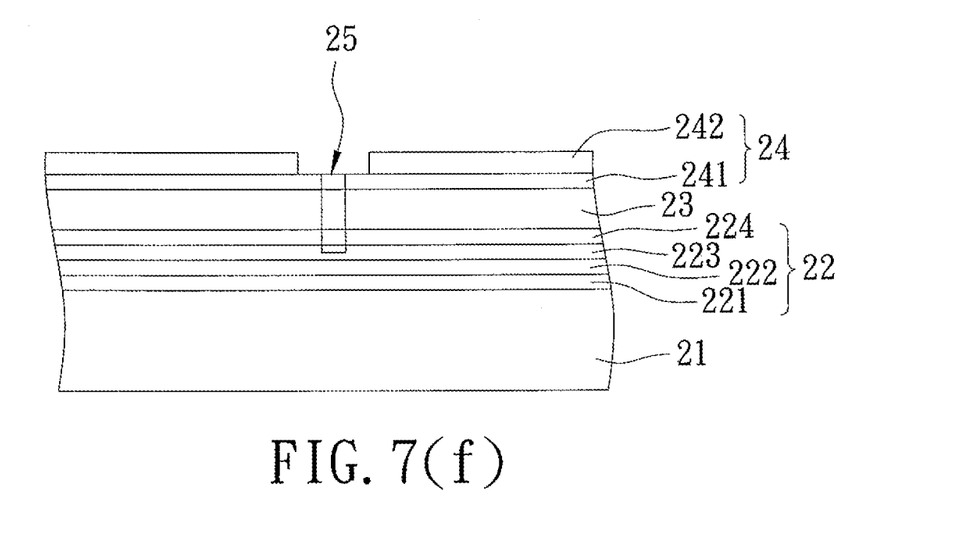

As shown in FIGS. 7(e) and 7(f), a magnetic layer 242 made from a magnetic metal is formed on the conductive substrate layer 241 by electroplating without covering the protruding part 272 of the filler 27. The filler 27 is etched from the protruding part 272 thereof and is entirely removed from the patterned passage unit 25. In the first preferred embodiment, the filler 27 is made from a photoresist material and is removed using acetone. Alternatively, the filler 27 may be $SiO_2$ which may be removed using HF.

Figure 8:
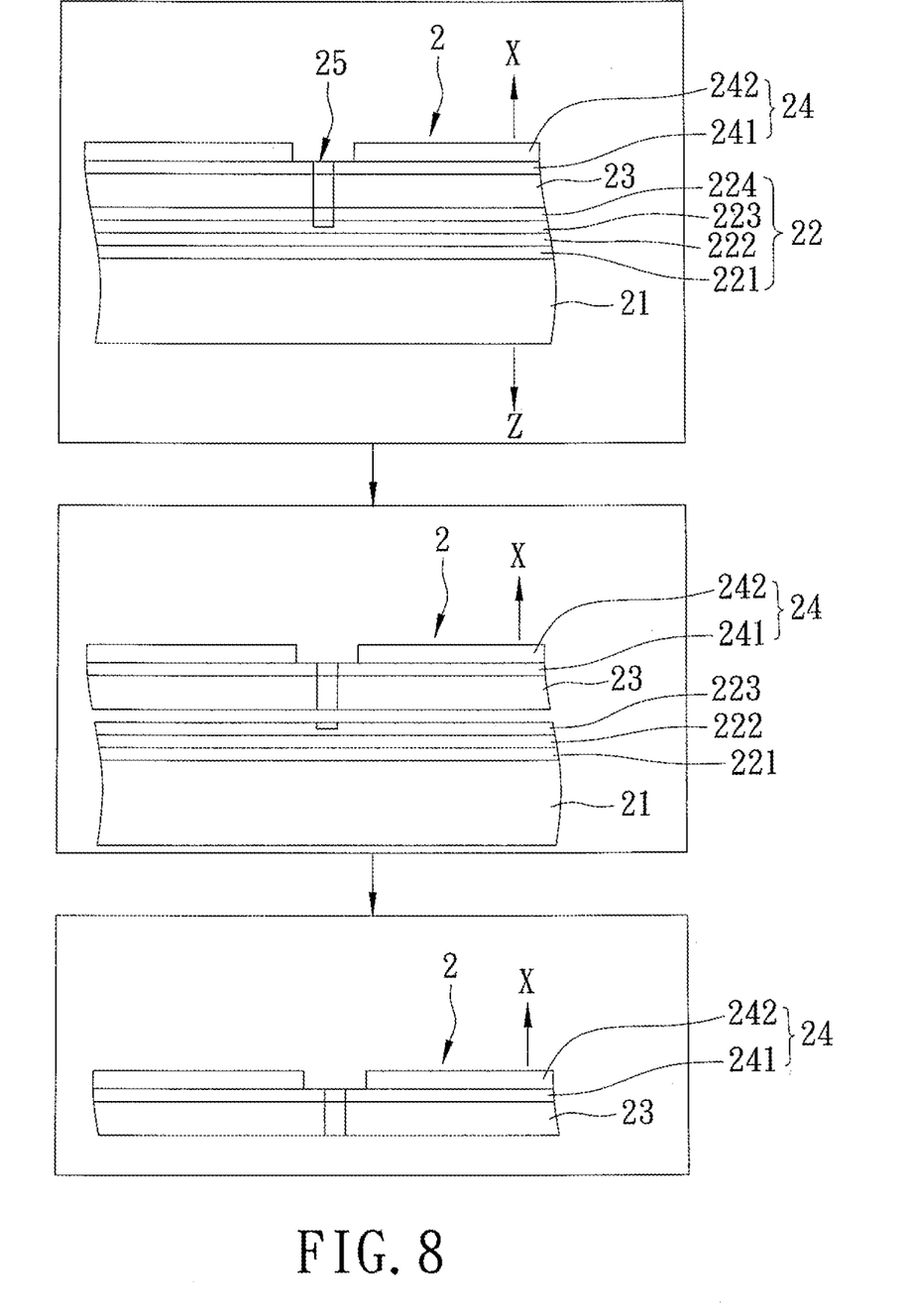

After the device substrate 24 and the patterned passage unit 25 are formed on the layer of the semiconductor structure 23 to define a plurality of semiconductor units 2, as shown in FIG. 8, the semiconductor units 2 are separated from the epitaxial substrate 21 by wet etching laterally the sacrificial layer 224 through the patterned passage unit 25 while a magnetic attractive force (indicated as "X") is applied to the device substrate 24. In particular, when the direction of the magnetic attractive force (X) is opposite to the direction of gravity (indicated as "Z" in FIG. 8), the upward magnetic attractive force (X) and the downward gravity force (Z) would enhance the removing rate of the sacrificial layer 224. In this embodiment, the sacrificial layer 224 is etched using HF.

Preferably, after the semiconductor units 2 are separated from the epitaxial substrate 21, the epitaxial substrate 21 may be recovered by chemically washing and etching. To be specific, the reusable epitaxial substrate 21 is obtained by etching the second buffer layer 223 and the etch termination layer 222 while the first buffer layer 221 remains thereon.

More preferably, before the sacrificial layer 224 is etched laterally, a protective film (not shown) may be formed covering a surface of the epitaxial substrate 21 opposite to the etch limiting film 22 so as to protect the epitaxial substrate 21 from etching by an etchant used in the subsequent wet etching step.

Figure 9:
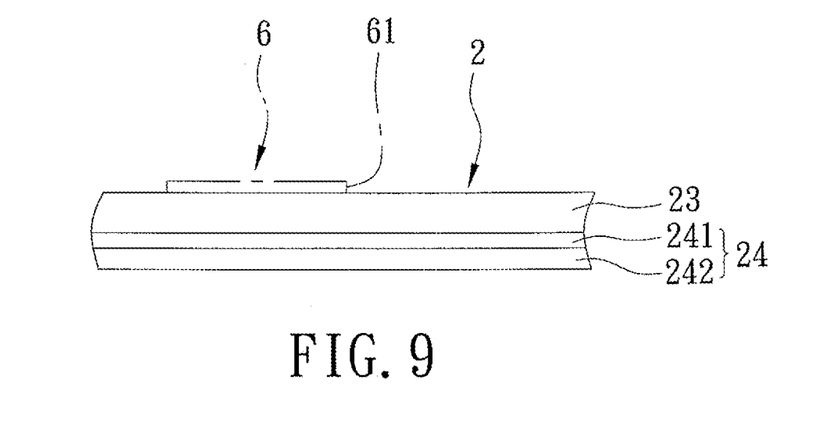
FIG. 9 is a schematic view illustrating an epitaxial semiconductor device made according to the first preferred embodiment of the method of this invention.

Referring to FIG. 9, an epitaxial semiconductor device 2 made according to the first preferred embodiment of the method of this invention includes the device substrate 24 and the layer of the semiconductor structure 23 formed on the device substrate 24. The device substrate 24 includes the magnetic layer 242 and the conductive substrate layer 241 formed on the magnetic layer 242 and has a pattern the same as that of the magnetic layer 242. In this embodiment, the conductive substrate layer 241 is made from a metal with a high light reflectivity, such as Cu. During operation, the internal heat generated by the epitaxial semiconductor device 2 may be dissipated through the metal conductive substrate layer 241 of the device substrate 24, thereby resulting in improvement of stability and increase of service life of the epitaxial semiconductor device 2.

A solar cell 6 may be obtained by forming an electrode 61 on the epitaxial semiconductor device 2. When exposed to light, a voltage or a corresponding electric current is generated between the electrode 61 and the device substrate 24 according to photovoltaic effect. The metal conductive substrate layer 241 of the device substrate 24 may reflect the light that is incident thereon, thereby resulting in an increase in the output photoelectric current. Alternatively, the epitaxial semiconductor device 2 may be used for manufacturing high-electron-mobility transistors (HEMTs) or any other semiconductor devices known to one skilled in the art.

Figure 10:
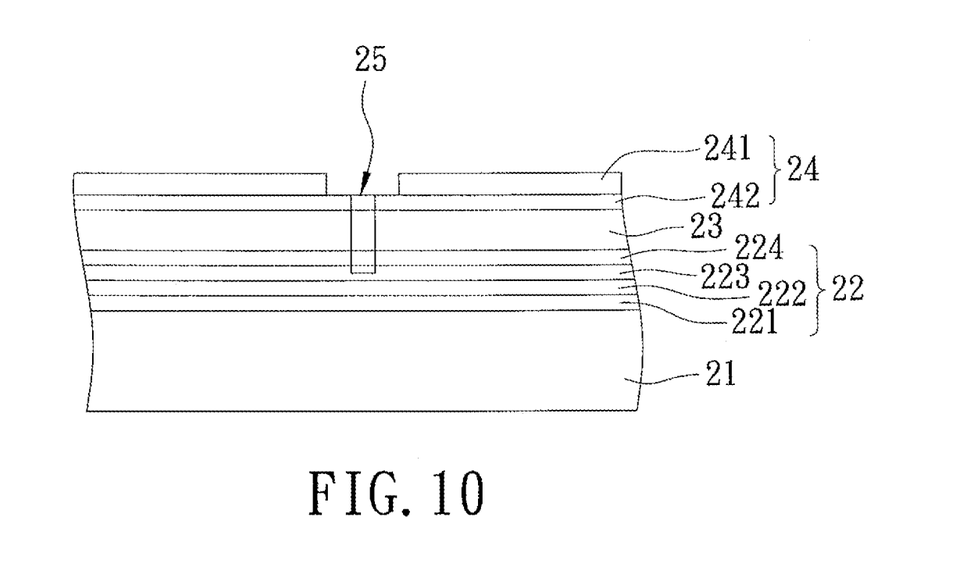
FIG. 10 shows a step of forming a device substrate and a patterned passage unit of the second preferred embodiment of a method of fabricating epitaxial semiconductor devices according to the present invention.

Referring to FIG. 10, the second preferred embodiment of the method of fabricating epitaxial semiconductor devices of the present invention has steps the same as those of the first embodiment, except that the magnetic layer 242 of the device substrate 24 is formed prior to the patterned conductive substrate layer 241 of the device substrate 24.

In conclusion, according to the method of the present invention, the layer of a semiconductor structure 23 can be efficiently separated from the epitaxial substrate 21 by virtue of the formation of the patterned passage unit 25 on the layer of the semiconductor structure 23 which causes an improved wet etching rate of the sacrificial layer 224.

In addition, the method of the present invention is conducted without using a polymer adhesive that has a poor thermal dissipation property. During operation, the internal heat generated by the semiconductor device 2 may be dissipated by virtue of the device substrate 24 of the device 2 that is made from metal. Therefore, the drawback, i.e., the thermal accumulation, associated with the device made from a conventional method may be overcome.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method of fabricating epitaxial semiconductor devices, comprising:
   (a) forming an etch limiting film that includes a sacrificial layer on an epitaxial substrate;
   (b) growing epitaxially layers of a semiconductor structure on the sacrificial layer;
   (c) forming on the semiconductor structure a layer of a device substrate that can be magnetized, and a patterned passage unit that extends from the device substrate to a depth as deep as the sacrificial layer such that a plurality of semiconductor units are defined in the semiconductor structure and the device substrate; and
   (d) separating the semiconductor units from the epitaxial substrate by etching laterally the sacrificial layer through the patterned passage unit while a magnetic attraction force is applied to the device substrate,
   wherein the etch limiting film is formed by forming on the epitaxial substrate a first buffer layer, an etch termination layer, a second buffer layer, and the sacrificial layer in the order as specified.

2. The method of claim 1, wherein the step (c) includes: forming a patterned conductive substrate layer from a conductive material on the semiconductor structure; etching the semiconductor structure and the etch limiting film using the patterned conductive substrate layer as a mask to form the patterned passage unit; filling a filler in the patterned passage unit until the filler overflows to a surface of the patterned conductive substrate layer; forming a magnetic layer from a magnetic metal on the patterned conductive substrate layer without covering the filler that overflows; and etching the filler from a part of the filler that overflows and removing entirely the filler from the patterned passage unit.

3. The method of claim 2, wherein
   the patterned passage unit includes a plurality of passages, which are arranged in a pattern and each of which extends downwardly from the device substrate to the sacrificial layer, the filler forming a filler body within each of the passages and a protruding part protruding laterally from a top periphery of the respective one of the passages.

4. The method of claim 1, further comprising a step of recovering the epitaxial substrate by chemically washing and etching the epitaxial substrate after the step (d).

5. The method of claim 1, further comprising a step of forming a protective film covering a surface of the epitaxial substrate opposite to the etch limiting film before the sacrificial layer is etched laterally.

6. The method of claim 1, wherein the device substrate includes a magnetic layer made of a magnetic metal, and a conductive substrate layer made of a conductive material.

7. The method of claim 6, wherein the step (c) includes: forming on the semiconductor structure one of the conductive substrate layer and the magnetic layer; etching the semiconductor structure and the etch limiting film by using the one of the conductive substrate layer and the magnetic layer as a mask to form the patterned passage unit; filling a filler in the patterned passage unit until the filler overflows from the patterned passage unit; forming the other one of the conductive substrate layer and the magnetic layer on the previous one of the conductive substrate layer and the magnetic layer without covering the filler that overflows; and etching the filler from a part of the filler that overflows and removing the filler entirely from the patterned passage unit.

8. The method of claim 2, wherein the filler is made from a photoresist material.

9. A method of fabricating epitaxial semiconductor devices, comprising:
   (a) forming an etch limiting film that includes a sacrificial layer on an epitaxial substrate;
   (b) growing epitaxially layers of a semiconductor structure on the sacrificial layer;
   (c) forming on the semiconductor structure a layer of a device substrate that can be magnetized, and a patterned passage unit that extends from the device substrate to a depth as deep as the sacrificial layer such that a plurality of semiconductor units are defined in the semiconductor structure and the device substrate; and
   (d) separating the semiconductor units from the epitaxial substrate by etching laterally the sacrificial layer through the patterned passage unit while a magnetic attraction force is applied to the device substrate,
   wherein the step (c) includes: forming a patterned magnetic layer from a magnetic metal on the semiconductor structure; etching the semiconductor structure and the etch limiting film using the patterned magnetic layer as a mask to form the patterned passage unit; filling a filler in the patterned passage unit until the filler overflows to a surface of the magnetic layer; forming a conductive substrate layer from a conductive material on the magnetic layer without covering the filler that overflows; and etching the filler from a part of the filler that overflows and removing the filler entirely from the patterned passage unit.

* * * * *